United States Patent
Darveaux et al.

[11] Patent Number: 5,152,451
[45] Date of Patent: Oct. 6, 1992

[54] CONTROLLED SOLDER OXIDATION PROCESS

[75] Inventors: Robert F. Darveaux, Coral Springs; Kingshuk Banerji, Plantation; Francisco da Costa Alves, Boca Raton, all of Fla.

[73] Assignee: Motorola, Inc., Schaumburg, Ill.

[21] Appl. No.: 678,410

[22] Filed: Apr. 1, 1991

[51] Int. Cl.⁵ ............................................. B23K 31/02
[52] U.S. Cl. ................................. 228/180.2; 228/223; 228/215
[58] Field of Search ............... 228/180.2, 207, 223, 228/254, 215, 191, 118, 180.1; 29/840, 832

[56] References Cited

U.S. PATENT DOCUMENTS

| | | | |
|---|---|---|---|
| 3,777,221 | 12/1973 | Tatusko et al. | 228/180.2 |
| 4,081,901 | 4/1978 | Miller | 228/254 |
| 4,196,839 | 4/1980 | Davis | 228/223 |
| 4,598,858 | 7/1986 | Stratil et al. | 228/214 |
| 4,719,134 | 1/1988 | Ely | 228/180.1 |
| 4,865,245 | 9/1989 | Schulte et al. | 228/180.2 |
| 4,925,522 | 5/1990 | Avellino et al. | 228/254 |

FOREIGN PATENT DOCUMENTS 215913  11/1984  Fed. Rep. of Germany ......... 29/840
7050220 10/1987  Japan ........................... 228/214

OTHER PUBLICATIONS

IBM Tech. Dis. Bull. "Solder Stop For Contact Pin", vol. 10, No. 1 Jun. 1967 p. 7.
*Fluxless SMD Soldering,* Circuits Manufacturing, Oct. 1984.

Primary Examiner—Richard K. Seidel
Assistant Examiner—Jeanne M. Elpel
Attorney, Agent, or Firm—Dale W. Dorinski; Daniel K. Nichols

[57] ABSTRACT

A method of soldering leadless components to a printed circuit board without using solder paste is disclosed. A thick layer of solder (42) is plated onto a printed circuit board (40), and an oxide layer (43) is formed by heating. Solder flux (45) is applied to those solder pads that are intended to be reflowed, and components (54) are placed. The printed circuit board is heated, and a solder joint (68) is effected between the components (54) and the circuit board (40), while the unfluxed solder pads (66) do not reflow and remain flat. Solder flux is then applied to the remaining solder pads (66) on the same or the opposite side of the circuit board. Additional components (77) are placed, and the circuit board (40) is reflowed a second time.

8 Claims, 6 Drawing Sheets

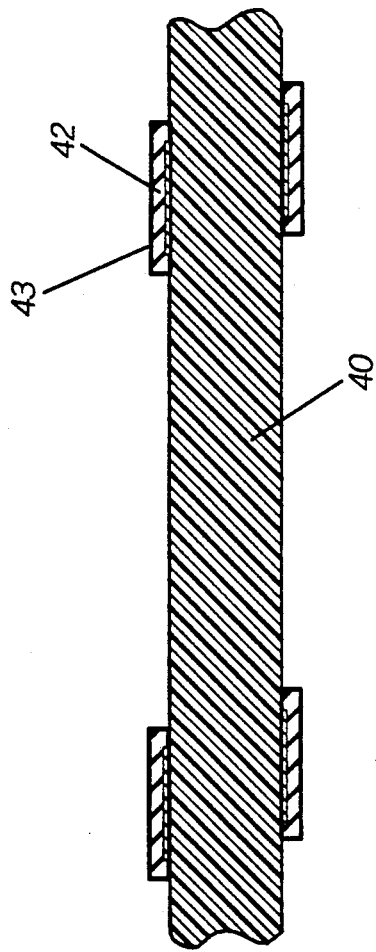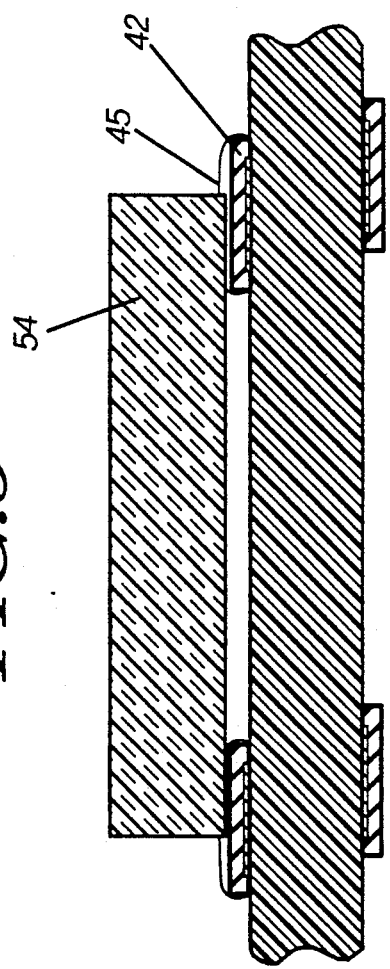

CONTROLLED SOLDER OXIDATION PROCESS

TECHNICAL FIELD

This invention relates generally soldering and more specifically to a method of reflow soldering electronic components to printed circuit boards.

BACKGROUND

Present board assembly processes using reflow soldering require the use of solder paste to provide the solder necessary to form solder joints between components and the printed circuit board. Solder paste is expensive, and a significant cost advantage could be accrued by eliminating it from a process if a thick coating of solder covered the underlying copper conductors. One method of providing a solder coating is dipping the printed circuit board in molten solder, but this method produces coatings that are thin in some areas and thick in others. The thin areas form an intermetallic compound of copper and tin on exposure to the oxidizing environment of the atmosphere, thereby rendering the printed circuit board unsolderable. The thick solder deposits on some of the solder pads become rounded due to the surface tension of the solder. These rounded or domed surfaces create significant problems when leadless components are placed manually or automatically. In addition, the uneven coating provided by the dipping process creates solder pads of varying heights, another undesirable feature when employing leadless components.

Methods of providing a thick solder coating using plating methods have been documented in the literature. For example, "Fluxless SMD Soldering" by Hendricks and Inpyn of General Electric Company in *Circuits Manufacturing*, Oct. 1984, details the use of heavy solder plating to assemble printed circuit boards and leadless components. Referring to FIG. 1, plating a printed circuit board 10 with a heavy coating of solder 12 is a preferred method to pre-apply solder on printed circuit boards because the plated solder surface is flat, a desirable condition when placing leadless components. Typically, solder flux 13 is applied to the solder 12 to remove oxides and to aid in reflowing the solder. However as seen in FIG. 2, this advantage of flat solder pads is lost for double sided boards because the solder 16 on one side domes up when the printed circuit board is heated to reflow the components 14 on the other side. When boards are plated with heavy coatings of solder, the reflow operation solders the components 14 to the board and insures adequate alloying of the solder 18 to the underlying copper 19. This reflowing procedure also causes the solder 16 to wet to the solder pads on those pads that do not contain components, such as those on the second side, creating a domed solder pad 30 which makes the automatic or manual placement of leadless components 15 difficult, due to the rounded nature of the top of the solder pad 20 (FIG. 3). Leadless components do not remain in place on the round surface, and become skewed and misaligned, resulting in solder defects.

Clearly, these methods of eliminating solder paste are not suitable for use with double sided printed circuit boards having surface mounted components, where components are soldered to the printed circuit board in two steps. An improved method of assembling double sided printed circuit assemblies that eliminates solder paste and provides flat solder pads for leadless components is certainly desirable. As a result, a need exists for an improved method of soldering double sided printed circuit boards that are pre-clad with solder.

SUMMARY OF THE INVENTION

Briefly, according to the invention, there is provided a soldering process, including providing a printed circuit board having a layer of solder on a plurality of solderable surfaces. An oxide coating is then formed on the surface of the solder. Solder flux is applied to at least a portion of the oxidized solderable surfaces. Electrical components are placed on the fluxed solderable surfaces and the printed circuit board is heated in order to melt the solder layer and effect a solder joint between the electrical components and the printed circuit board.

In a further embodiment of the invention, the printed circuit board includes solder applied to solderable surfaces on both of its sides. The solder is then oxidized and solder flux is applied to at least a portion of the oxidized solderable surfaces on one side of the printed circuit board. Electrical components are placed on the fluxed solderable surfaces, and the printed circuit board is heated in order to melt the solder layer and effect a solder joint between the electrical components and the printed circuit board. Solder flux is then applied to at least a portion of the oxidized solderable surfaces on the opposite side of the printed circuit board. Components are placed on these fluxed solderable surfaces, and the printed circuit board is again reflowed in order to solder the electrical components to the other side of the printed circuit board.

BRIEF DESCRIPTION OF THE DRAWINGS

FIG. 4 is a cross-sectional view of an oxidized substrate in accordance with the present invention.

FIG. 5 is a cross-sectional view of the substrate of FIG. 4 with flux and a component applied.

DETAILED DESCRIPTION OF THE PREFERRED EMBODIMENT

Figure 1:
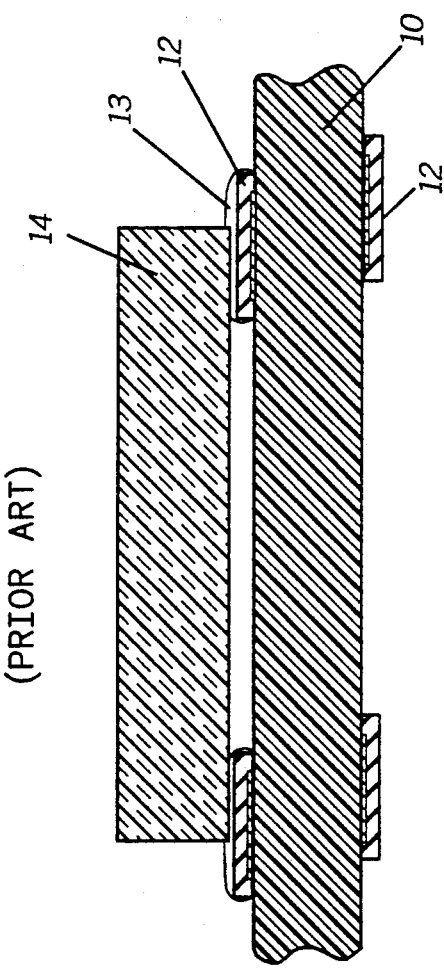
FIG. 1 is a cross-sectional view of a component on a solder clad substrate prior to reflow soldering as practiced in the prior art.
Figure 2:
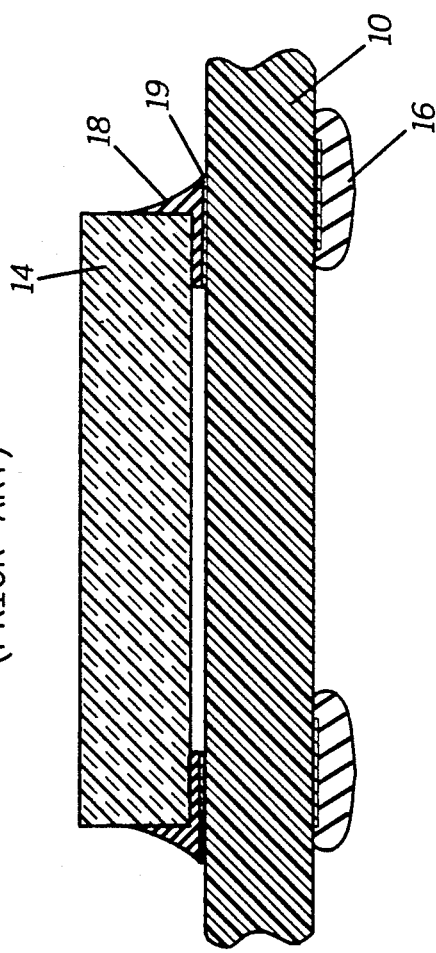
FIG. 2 is the same cross-sectional view after reflow soldering as practiced in the prior art.
Figure 3:
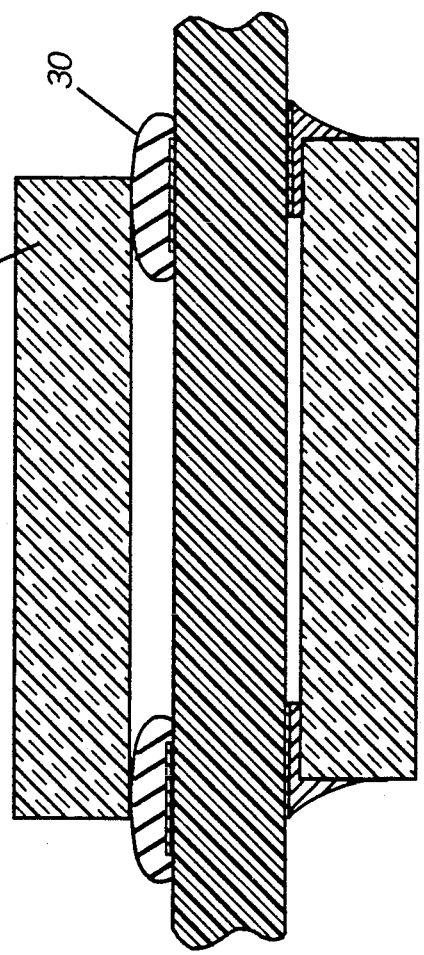
FIG. 3 is a cross-sectional view of a second component placed on the reflowed substrate as practiced in the prior art.

Solder required to accomplish the formation of solder joints is provided on the printed circuit board by plating heavy layers of solder onto the circuit board using the methods disclosed in the background of the invention. The thickness of the solder layer can vary depending on the type of component to be soldered. For example, a plated solder thickness of about 0.001 inches is sufficient for reflow soldering a fine pitched component such as a pad array chip carrier, but not adequate for a chip capacitor. Larger components such as capacitors require a greater volume of solder and as such, a solder thickness of up to about 0.005 inches may be plated. Referring to FIG. 4, the preferred embodiment, after the solder 42 is coated on the printed circuit board 40, the solder is oxidized in a controlled manner to create a uniform, controllable layer of oxide 43 (as shown by the heavy lines, exaggerated in size in the drawings, in order to facilitate understanding of the invention). The oxidation step may be accomplished by, for example, heating the printed circuit board 40 in an oven for a brief period of time, in order to accelerate the oxide 43 formation. It will be appreciated by those skilled in the art that the formation of a proper solder oxide coating is not a trivial matter, since freshly prepared printed circuit boards without an oxide coating will readily solder without the use of a fluxing agent, while heavily oxidized solder surfaces are difficult if not impossible to solder when using even the strongest of fluxes. The creation of a proper oxide coating is therefore a function of the condition of the solder surface, and as such, the oxidizing conditions must be determined empirically for the group of printed circuit boards of interest. However, as a guideline, temperatures between about 80 and about 125 degrees Centigrade are typically employed, for periods of 120 to 10 minutes respectively. Care must be taken not to exceed the upper temperature limit in order to prevent oxidation of the underlying copper metal on the printed circuit board. Examples of oxidizing conditions for a solder coated printed circuit board will now be shown.

EXAMPLE 1

A "freshly" manufactured printed circuit board with a plated solder coating was reflowed in a conveyorized infrared reflow oven. The printed circuit board was reflowed in an "as received" condition, that is, without any thermal aging and without the use of any flux. Prior to reflow the solder pads were shiny and flat. After reflow, the solder pads had domed slightly. This treatment did not produce the desired results, and was deemed unsatisfactory.

EXAMPLE 2

Another printed circuit board from the same lot as Example 1 was reflowed in a conveyorized infrared reflow oven with a rosin based solder flux applied to the solder pads. After reflowing, the solder pads were significantly domed, rendering them unsuitable for placement of surface mounted components. Since this treatment did not produce the desired results, it was deemed unsatisfactory.

EXAMPLE 3

Another printed circuit board from the same lot as Example 1 was aged in an oven at 80° C. for 30 seconds. The same rosin based solder flux as in Example 2 was applied to the solder pads and the board was reflowed in a conveyorized infrared reflow oven. After reflowing, the solder pads were significantly domed, rendering them unsuitable for placement of surface mounted components. Since this treatment did not produce the desired results, it was deemed unsatisfactory.

EXAMPLE 4

Another printed circuit board from the same lot as Example 1 was aged in an oven at 80° C. for 5 minutes. The same rosin based solder flux as in Example 2 was applied to the solder pads and the board was reflowed in a conveyorized infrared reflow oven. After reflowing, the solder pads were significantly domed, but to a lesser extent than seen in Example 3. Since this treatment did not produce the desired results, it was deemed unsatisfactory.

EXAMPLE 5

Another printed circuit board from the same lot as Example 1 was aged in an oven at 80° C. for 30 minutes. The same rosin based solder flux as in Example 2 was applied to the solder pads and the board was reflowed in a conveyorized infrared reflow oven. After reflowing, the solder pads were slightly domed. Since this treatment did not produce the desired results, it was deemed unsatisfactory.

EXAMPLE 6

Two additional printed circuit boards from the same lot as Example 1 were aged in an oven at 125° C. for 5 minutes. The same rosin based solder flux as in Example 2 was applied to the solder pads and the board was reflowed in a conveyorized infrared reflow oven. After reflowing, the solder pads were not domed, and deemed to be suitable for use with surface mounted components, indicating that this treatment is a desirable oxide forming condition.

EXAMPLE 7

A printed circuit boards was aged in an oven at 125° C. for 5 minutes. A rosin based solder flux was applied to the solder pads on one side of the board. Components were added to the fluxed solder pads, and the assembly reflowed in a conveyorized infrared reflow oven. After reflowing, the board was inverted and a rosin based solder flux was applied to the solder pads on the opposite side of the board. Components were placed on the solder pads, and the assembly was reflowed for a second time. The components rested squarely on the solder pads and remained in place during reflow. This treatment was judged to produce desirable oxide coatings.

Figure 6:
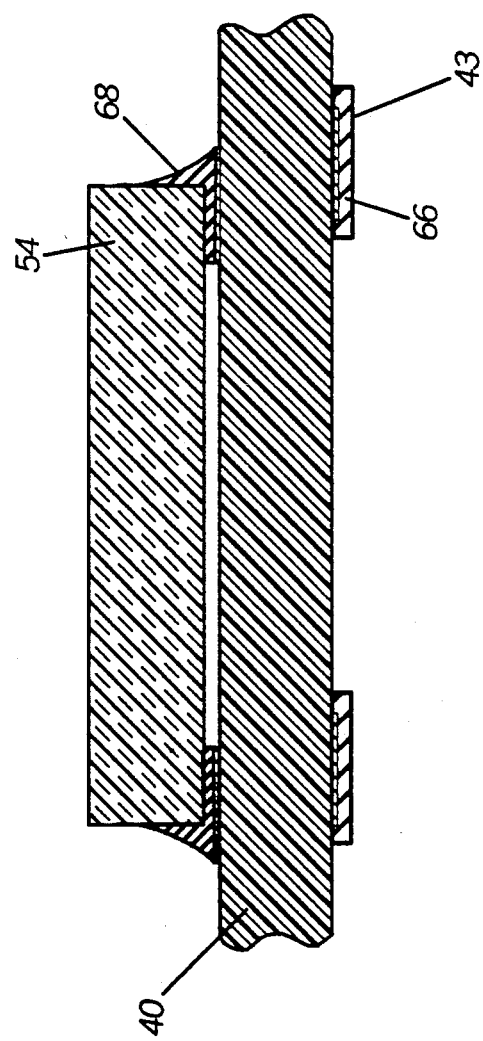
FIG. 6 is the substrate of FIG. 5 after reflow soldering.

Referring now to FIG. 5, a thin layer of flux 45 is applied to selected oxidized solder pads 42 by roller coating, spraying, syringe application, screen printing, transfer printing, dipping, etc., thereby coating all or part of one side of the board. This 'tacking' flux 45 provides the adhesion or tack to aid in temporary positioning of the surface mount components 54. The assembly is reflowed using methods such as infrared, vapor phase, conduction heating, or other methods well known to those skilled in the art. After reflowing the solder, it can be seen in FIG. 6 that the unfluxed solder pad 66 on the opposite side of the printed circuit board retains a flat surface, because the oxide coating 43 has prevented the solder 66 from wetting to itself and the underlying metallization. The use of a controlled oxide coating 43 on the solder 66 prevents the solder from further reflow and thereby keeps the desirable flat surface intact.

Figure 7:
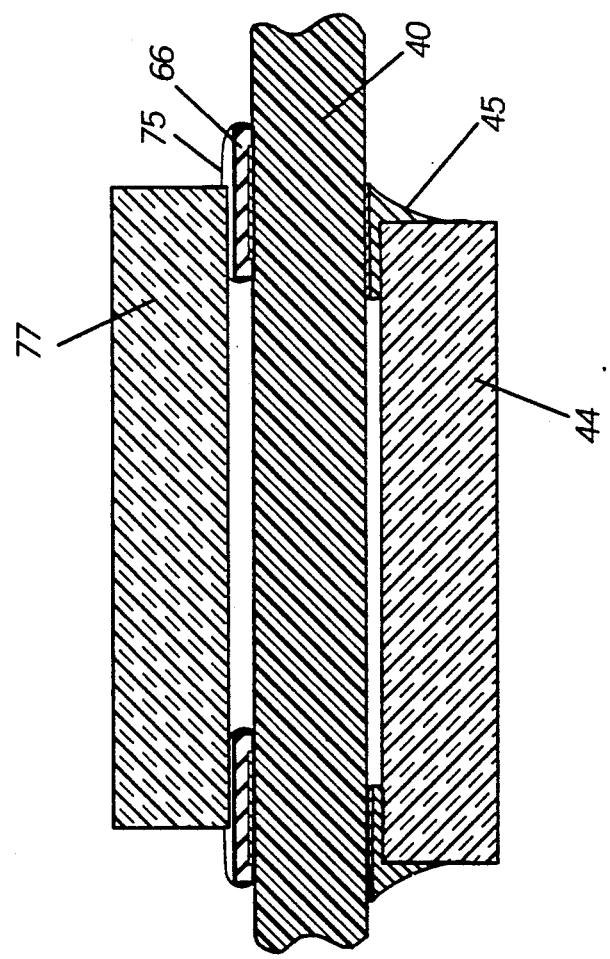
FIG. 7 is the substrate with flux and a second component applied.
Figure 8:
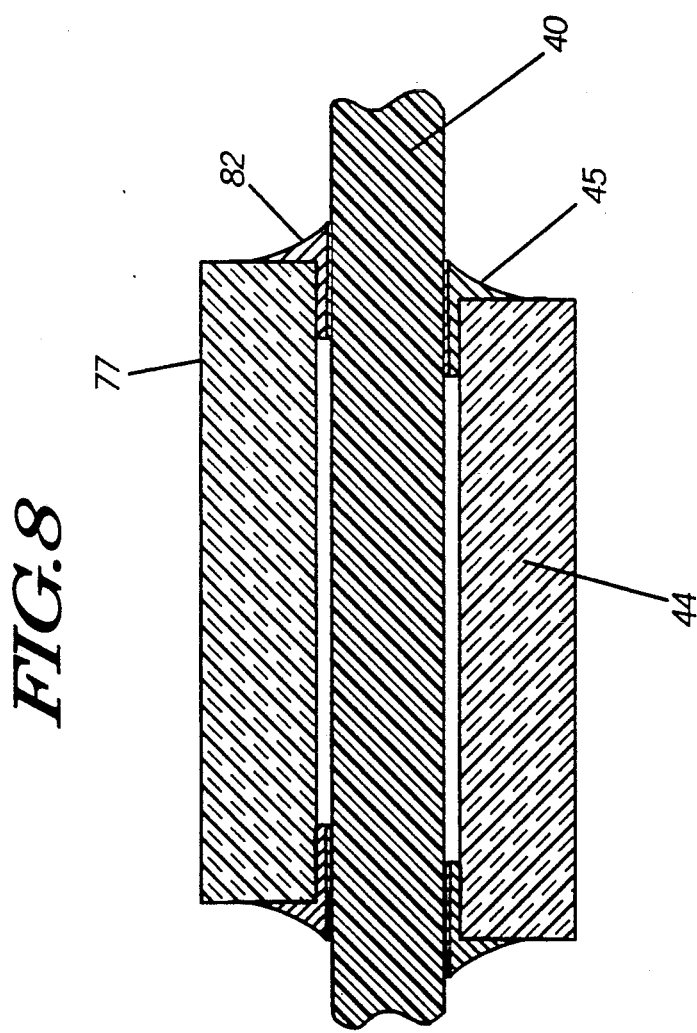
FIG. 8 is a cross-sectional view of the substrate after the second reflow soldering in accordance with the present invention.

The assembly is now inverted (FIG. 7), and a second coating of tack flux 75 is applied to the solder pads 66 of interest. Typically, these solder pads 66 are on the second side of the printed circuit board 40, but all of the pads do not need to be fluxed if they will not have components attached to them, and in selected cases, the unfluxed solder pads are on the original side of the printed circuit board 40. For example, in some cases solder pads are used as electrical test points for the circuit, and the ability to have flat test pads is very desirable when using automatic test probes. In other cases, a third soldering operation will place additional components such as switches or chip carriers, and the selected solder pads should be kept in a flat state until needed. In one version of an alternate embodiment, the component 77 is now placed in the tacking flux 75 and the assembly is reflowed using conventional methods selected by the reader as recited above. The tack flux 75 now chemically cleans the previously oxidized surfaces, rendering them eminently solderable, and a proper solder joint 82 between the printed circuit board 40 and the component 77 is effected (FIG. 8).

Other methods of oxidizing the solder surface may also be employed, or example, the oxide formation may be effected under partial vacuum, or be effected chemically by immersion in selected oxidizing solutions.

The examples outlined in the above text and referenced drawings, while illustrative, are not meant to be considered limiting and other variations of the controlled solder oxidation process may be envisioned and still be considered to fall within the spirit of the invention.

What is claimed is:

1. A method of soldering, comprising the steps of:
   providing a printed circuit board having a plurality of solderable surfaces on at least one side;
   providing a layer of solder on the solderable surfaces;
   heating the printed circuit board so as to form an oxide coating on a surface of the layer of solder;
   applying a fluxing agent to only a portion of the oxidized layer of solder;
   providing one or more electrical components;
   placing the electrical components on the fluxed solder portions; and
   heating the printed circuit board and the electrical components in order to melt the solder layer and effect a solder joint between the electrical components and the printed circuit board.

2. The method as described in claim 1, wherein the step of providing a layer of solder comprises plating a layer of solder.

3. The method as described in claim 2, wherein the plated solder layer is greater than about 0.001 inches but less than about 0.005 inches thick.

4. The method as described in claim 1, further comprising the additional steps of:
   applying a fluxing agent to at least a portion of the solderable surfaces on the opposite side of the printed circuit board;
   providing one or more electrical components;
   placing the electrical components on the fluxed solder portions; and
   heating the printed circuit board and the electrical components to melt the solder layer in order to effect a solder joint between the electrical components and the printed circuit board.

5. A method of soldering, comprising the steps of:
   providing a printed circuit board having solderable surfaces on two opposite sides, the solderable surfaces comprising surfaces plated with solder;
   forming an oxide coating on the solderable surfaces by heating the printed circuit board in an oxidizing environment to a first temperature;
   applying a fluxing agent to at least a portion of the solderable surfaces on one side of the printed circuit board;
   providing one or more electrical components;
   placing the electrical components on the fluxed solderable surfaces;
   heating the printed circuit board and the electrical components to a temperature greater than the first temperature in order to melt the solderable surfaces and effect a solder joint between the electrical components and the printed circuit board;
   applying a fluxing agent to at least a portion of the solderable surfaces on the other side of the printed circuit board;
   placing the electrical components on the fluxed solder portions; and
   heating the printed circuit board to a temperature greater than the first temperature in order to solder the electrical components to said other side of the printed circuit board.

6. The method as described in claim 5, wherein the solder plating is greater than about 0.001 inches but less than about 0.005 inches thick.

7. A method of soldering, comprising the steps of:
   providing a printed circuit board having solderable surfaces on two opposite sides, the solderable surfaces comprising surfaces plated with solder;
   forming an oxide coating on the solderable surfaces by heating the printed circuit board in an oxidizing environment to a first temperature;
   applying a fluxing agent to at least a portion of the solderable surfaces on one side of the printed circuit board;
   providing one or more electrical components;
   placing the electrical components on the fluxed solderable surfaces;
   heating the printed circuit board and the electrical components to a temperature greater than the first temperature in order to melt the solderable surfaces and effect a solder joint between the electrical components and the printed circuit board;
   applying a fluxing agent to the remaining solderable surfaces on said one side of the printed circuit board;
   placing the electrical components on the fluxed solder portions; and
   heating the printed circuit board to a temperature greater than the first temperature in order to solder the electrical components to said one side of the printed circuit board.

8. The method as described in claim 7, further comprising the additional steps of:
   applying a fluxing agent to at least a portion of the solderable surfaces on the other side of the printed circuit board;
   providing one or more electrical components;
   placing the electrical components on the fluxed solder portions; and
   heating the printed circuit board and the electrical components to melt the solder layer and effect a solder joint between the electrical components and said other side of the printed circuit board.

* * * * *